United States Patent [19]
Mielke

[11] Patent Number: 4,963,825
[45] Date of Patent: Oct. 16, 1990

[54] METHOD OF SCREENING EPROM-RELATED DEVICES FOR ENDURANCE FAILURE

[75] Inventor: Neal R. Mielke, Redwood City, Calif.

[73] Assignee: Intel Corporation, Santa Clara, Calif.

[21] Appl. No.: 455,511

[22] Filed: Dec. 21, 1989

[51] Int. Cl.$^5$ ............................................. G01R 31/28
[52] U.S. Cl. ............................... 324/158 R; 365/201; 371/21.4
[58] Field of Search ...................... 324/158 R, 158 T; 371/21.1, 21.4; 365/201, 185

[56] References Cited

U.S. PATENT DOCUMENTS

| | | | |
|---|---|---|---|
| 4,760,032 | 7/1988 | Turner | 324/158 T |
| 4,841,482 | 6/1989 | Kreifels et al. | 371/21.4 |
| 4,860,261 | 8/1989 | Kreifels et al. | 365/201 |

*Primary Examiner*—Ernest F. Karlsen
*Attorney, Agent, or Firm*—Blakely, Sokoloff, Taylor & Zafman

[57] ABSTRACT

A method for screening EPROM-related integrated circuits for endurance failure is described. The screening method is based on a measurement of the number and distribution of cells within the EPROM-related device which program and/or erase significantly further and faster than "normal" cells. The erase speed of the floating gate cells are first measured to obtain an erase distribution for the IC in which the percentage of bits erased is plotted as a function of the applied gate threshold voltage. The number of bits which are located in the erase tail region of the distribution is then identified. If this number exceeds a certain percentage of the total bits in the array the IC is classified as one which is likely to suffer early endurance failure. Compared to traditional cycling screens, the method of the present invention identifies unreliable material non-destructively and does not require extra floating-gate cells or error-correction logic overhead.

15 Claims, 4 Drawing Sheets

FIG__1

FIG_2

FIG_3

FIG_4

METHOD OF SCREENING EPROM-RELATED DEVICES FOR ENDURANCE FAILURE

FIELD OF THE INVENTION

The present invention relates generally to the field of reliability screening of integrated circuits. More particularly, the present invention relates to the testing and/or stressing of floating gate memory cells for the purpose of screening for endurance failures in such integrated circuits.

BACKGROUND OF THE INVENTION

From a practical standpoint, there are two conditions which must be satisfied in order for VLSI circuit fabrication to continue to be a useful, burgeoning technology. First, the fabricated circuits must be capable of being produced in large quantities at costs which are competitive with alternative methods of achieving the same circuit and system functionality. Second, the circuits must be capable of performing their functions throughout their intended useful life.

In order to deal successfully with these two requirements, various methods have been developed to identify the diverse mechanisms which seriously limit the yield and reliability of VLSI circuits. Likewise, prodigious attempts have been made at developing accurate yield and reliability modeling parameters to enable the manufacturer of VLSI circuits to better predict the reliability of his product. Economically, it is very critical for the circuit fabricator to be able to detect those integrated circuits of a certain class which are unreliable due to a particular type of reliability failure mechanism.

Ideally, in a properly fabricated wafer of integrated circuits, one would expect all of the circuits to be good functional devices. However, in practice, the number of good circuits per wafer may range anywhere from 0 to 100%, depending on the process employed and the relative complexity of the circuit. The causes for less than perfect yield often depend on the category or class of ICs which is being fabricated. For instance, low yield and reliability may be due to parametic processing problems, circuit design problems or random point defects in the circuit.

One class of integrated circuits contain floating-gate memory devices which utilize electron tunneling to either add electrons to, or remove electrons from, the floating gates. In other words, electron tunnelling is employed to either program and/or erase those cells. Such ICs are often called EEPROMs, E²PROMSs, flash EPROMs, or non-volatile RAMS. Floating gate cells which rely on tunnelling may also be used in other types of integrated circuits as well.

One predominant reliability failure mechanism has plagued floating gate devices in the past. This specific mechanism involves the dielectric breakdown of the dielectric through which electrons tunnel during programming and/or erasing operations. This dielectric is commonly referred to as the tunnel or gate oxide. Following dielectric breakdown, the oxide separating the floating gate from the substrate no longer behaves as an insulating material. As a result, electrons previously programmed into the floating gate do not remain there in the course of the normal operation of the device. Instead, these electrons "leak" off of the floating gate—tunneling their way back to the substrate.

As is appreciated by practioners in the art, loss of electrons from the floating gate dramatically affects data retention rates in such devices. By way of example, int he case of flash EPRONMs submicroscopic defects in the tunnel oxide near the drain region leads to premature dielectric breakdown; often 10 to 100 times sooner than would normally be the case. Such breakdown usually occurs after repeated program/erase cycling of the IC. The ability of an EPROM-type device to survive such cycling is called the IC's "reliability" or "endurance". An IC failing after a given cycling operation is frequently referred to as suffering an "endurance failure".

Note that the term "reliability" as used in this context, refers to the probability that an IC will perform a required function for a stated period of time. For floating gate memory device, the "required function" is generally defined as its ability to cycle a given number of times. For example, properly fabricated EEPROMs and flash EPROMs are generally expected to cycle anywhere between 10,000 and 100,000 times before experiencing endurance failure.

In the past, once a floating-gate circuit has been completely fabricated, there has no been a way of predicting how many cycles that part may endure before suffering destructive dielectric breakdown. Consequently, manufacturers have had to implement elaborate screening procedures to eliminate those devices which are destined to bail within a relatively short period of time. The traditional method of screening dielectric breakdown endurance failures involves extensive program/erase cycling of the ICs. The devices in question, or a statistical sample of them, are cycled many times and then tested for proper functionality, which usually includes a test for data retention. This type of screening generally involves discarding the failed ICs. Alternatively, the IC may be repaired using redundant circuitry which can be switched in to replace defective circuit elements. Lot-/acceptance criteria may also be used so that an entire lot of wafers may be rejected based upon the percent fail in the cycling screen or some other measure of endurance of the lot or the samples taken from it.

This method is not without its disadvantages. For instance, the cycling test is quite expensive and time consuming; often typing up expensive test equipment. Moreover, when used with a lot-acceptance criteria, the cycling method requires rejecting reliable ICs along with unreliable ones (since even an "unreliable" lot may consist of 90% reliable ICs). Furthermore, when used as a 100% test to screen all material of unreliable ICs, the cycling method has all of the disadvantages inherent to any "aging" screen. Cycling ages all integrated circuits equally, Thus both reliable and unreliable devices are aged in the effort to detect those ICs which are destined to fail at an early age. Obviously, this reduces the useable lifetime of the reliable devices.

In certain circumstances, cycling screen also inherently depends upon the assumption that the IC populations failure rate is a decreasing function of the number of cycles; otherwise, the cycling screen would increase rather than decrease the failure rate. In those instances where the failure rate decreases slowly as a function of the number of cycles, achieving endurance goals may require excessive cycling and resultant yield loss. Therefore, such screens work best when there exists a very discrete infant mortality population. Unfortunately, this has not traditionally been in case for EEPROM-related devices. Accordingly, manufactures have been forced to perform cycling to eliminate most failure problems while excepting the risk that a significant number of the remaining ICs (i.e., those passing the screening test) may prove unreliable in future use.

Another existing method to reduce the dielectric breakdown endurance problem is through error correction; often modified Hamming-code error correction. This involves using extra error correction cells (i.e., parity bits) to store redundant information sufficient to reconstruct the correct data when one of the floating gate cells suffers dielectric breakdown. Error correction can either be built directly into the integrated circuit design or incorporated into the external system environment by the user of the integrated circuit device.

The error correction methods are generally effective but expensive. Error correction schemes require additional floating gate cells to store the redundant error correction information. For byte-level error correction, this requires a 50% increase in the number of floating gate cells. In other words, 12 memory cells are required for every 8 bits of data to be stored. When built into the integrated circuit itself, error correction requires additional support circuitry which is expensive and which can reduce the overall speed of the integrated circuit (since correcting errors takes additional time). Incorporated into the system environment, error correction also increases the complexity and cost of the system.

Accordingly, one object of the present invention is to provide a cost-effective way of detecting those floating gate integrated circuits which are destined to early failure due to premature breakdown of the tunnel dielectric.

It is another object of the present invention to provide a means of screening floating-gate ICs employing tunneling for programming and/or erasing for dielectric breakdown endurance failures.

It is yet another object of the present invention to provide a means for statistically predicting the useful life of an EPROM-type integrated circuit.

SUMMARY OF THE INVENTION

The presently invented method allows a user to reliably predict an endurance of an EPROM-related integrated circuit from the shape of its initial program and/or erase distribution. Specifically, the endurance prediction can be based on a measurement of the number and distribution of cells within the EPROM-related device which program and/or erase significantly further and faster than "normal" cells. The prediction can be used to discard unreliable material, to classify material into grades, to accept or reject lots of material, to replace unreliable cells with redundant cells, or for other purposes.

In one embodiment of the invention, the erase speed of the floating gate cells are first measured to obtain an erase distribution for the IC. This allows plotting the percentage of bits erased as a function of the applied gate threshold voltage. The percentage of bit which are located in erase tail region of the distribution are also identified. Bits located in the tail region erase relatively fast when compared to the remaining bits in the array. If the number of bits in the erase tail exceeds a certain percentage of the total bits in the array, the IC is classified as one which is likely to suffer early endurance failure; otherwise the IC is certified as being endurance reliable.

Compared to traditional cycling screens, the invented method is less costly to implement simply because it is much easier and quicker to administer. The invented method also avoids the drawbacks of the prior art aging screen. Reliable material is not aged by the test. Relatively unreliable material is identified non-destructively rather than being destroyed, so such material can be classified as a lower grade of product for undemanding applications rather than being discarded. Thus, the new method improves endurance even when the failure rate is not a decreasing function of cycles. Moreover, the presently invented method does not require extra floating-gate cells or error-correction logic overhead.

BRIEF DESCRIPTION OF THE DRAWINGS

The novel features believed characteristic of the invention are set forth in the appended claims. This invention itself, however, as well as other features and advantages thereof, will be best understood by reference to the detailed description which follows, read in conjunction with the accompanying drawings, wherein;

FIG. 2 also illustrates the difference in distribution of the tail-bit percentages for each of the EEPROM devices.

DESCRIPTION OF THE PREFERRED EMBODIMENTS(S)

A method for screening integrated circuits for endurance reliability failures is described. In the following description, numerous specific details are set forth, such as particular device types, voltages, etc., in order to provide a more through understanding of the present invention. It will be obvious, however, to one skilled in the art that these specific details need not be used to practice the present invention. In other instances, other well-known structures, circuits and techniques have not been described in detail in order to avoid unnecessarily obscuring the present invention.

According to the method of the present invention, EPROM-related integrated circuits may be accurately screened for the likelihood of premature endurance failure. This screening method is preferably based on a measurement of the distribution of cells which erase significantly further and faster than "normal" cells. Thus, the present invention allows the semiconductor manufacturer to operate more efficiently while radically improving the predicatable reliability of part actually sold.

By erase (and/or program) distributions, what is meant is the statistical distribution (across the many floating-gate cells with the IC) of the degree to which the cells program and erase. Not all cells, for example, program or erase equally fast. The program or erase distribution is the statistical distribution of this variation, often expressed graphically as a histogram or integrated and plotted as a cumulative probability.

Figure 1:
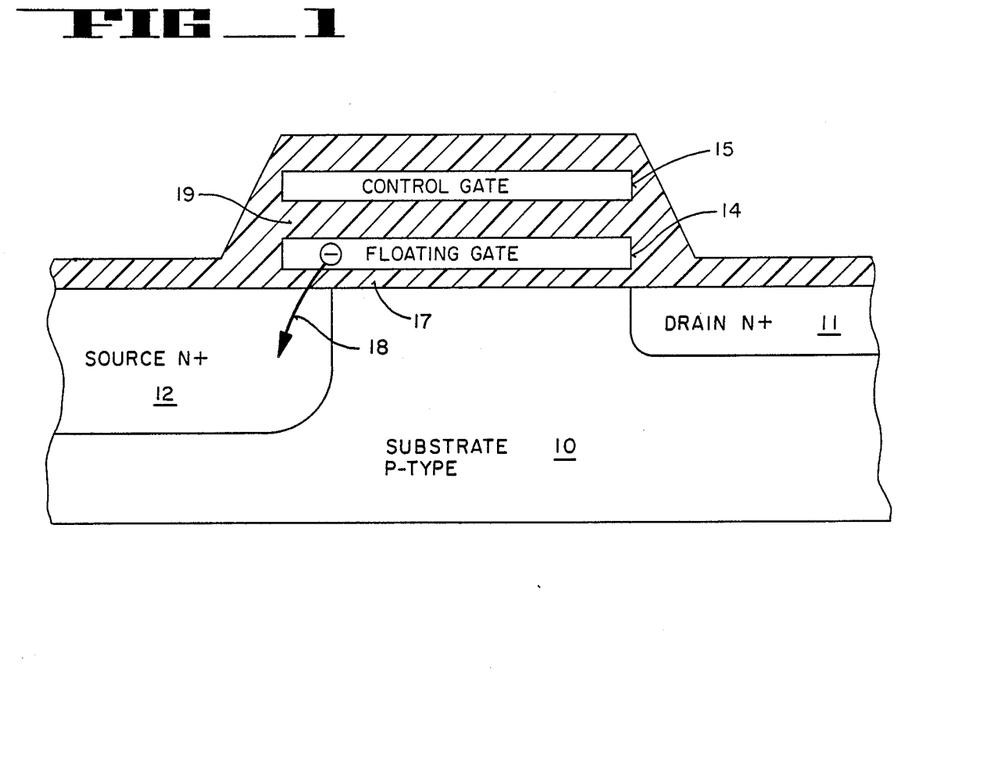
FIG. 1 is a cross-sectional view of a floating-gate memory device which utilizes tunneling of electrons through a thin gate oxide during erasing operations.

With reference to FIG. 1, there is shown a cross-sectional view of a floating gate memory cell which is both electrically programmable and electrically erasable. Such a memory cell is typically referred to as a flash EPROM. The cell of FIG. 1 includes source and drain regions 12 and 11, respectively, formed in a p-type silicon substrate 10. The separation between source and drain regions 12 and 11 define a channel over which a tunnel oxide 17 is grown. Directly above the floating gate 14 is a control gate 15. Control gate 15 is insulated from floating gate 14 by a layer 19 which normally comprises silicon dioxide or a nitrite oxide composite. Both control gate 15 and floating gate 14 are usually formed of polycrystalline silicon (i.e., polysilicon).

As is appreciated by practitioners int he art, the floating gate memory cell of FIG. 1 may be erased (i.e., charge is removed form floating gate 14) by Fowler-Nordheim tunnelling of electrons form floating gate 14 to source region 12. This is depicted occurring in FIG. 1 by arrow 18. Fowler-Nordheim tunnelling of electrons may also be utilized by certain types of floating gate memory cells during programming. As previously discussed, submicroscopic defects present in oxide 17 are responsible for early endurance failures in floating gate devices. This phenomena is manifested in a change in the program and/or erase characteristics of the cell (i.e., defective cells erase faster).

The degree of programming/erasing can be measured in terms of the time required for an individual cell to program to some level for a fixed programming voltage. By way of example, a fixed programming voltage is first applied to the cells for a certain time interval and then the voltage threshold of each of the cells is measured. The cell are then completely erased and the process repeated with successively increased time intervals. This permits the formation of a cumulative distribution of the programming properties of the cells within an array.

Another way that the degree of programming can be measured is in terms of the programming voltage required for a cell to program to some level for a fixed programming time. Alternatively, the same measure can be defined in terms of the level to which a cell programs for a fixed programming time and voltage. "Level" in this context refers to cell threshold voltage ($V_T$) or any other defined measure that is related to the amount of charge stored on the floating gate of the cell. Of course, all of the above discussion applies equally well with respect to the degree of erasing (i.e., the degree of charge removal from the floating gate).

Experimentally, it has been observed that cells which program or erase further and faster than normal cells experience earlier endurance failure. It has been postulated by researchers that the tunnel dielectrics in these cells contains small defects which enhance the transfer or tunnelling of electrons form floating gate to substrate or source and which may cause the tunnel dielectric to breakdown prematurely after repeated cycling.

According to the presently invented method for screening floating gate ICs for endurance failure, two basic steps are performed: First, characteristics of the program and/or erase distributions are measured on the IC under consideration—preferably before that IC has undergone significant cycling, since the program and erase distributions of an IC often change dramatically after a few program/erase cycles. It is preferred to generate the distributions form measurements in the first cycle in the deivce's life. In cases where this is difficult, or the device has already undergone an number of cycles. The presently invented method can be applied with lesser effectiveness after some cycling. Alternatively, a high temperature anneal can be used to reverse some of the effects of cycling on the program/erase distributions.

One way in which the area distribution may be obtained is by initially programming each of the cells within the memory array. Afterward, an erase potential is applied to the array for a fixed amount of time. The number of cells erasing at that potential is then recorded. The erase potential is then successively increased—with the number of erased cells being recorded for each increment. This process continues until charge has been removed from all of the cells within the array (i.e., all of the cells have been erased).

Figure 2:
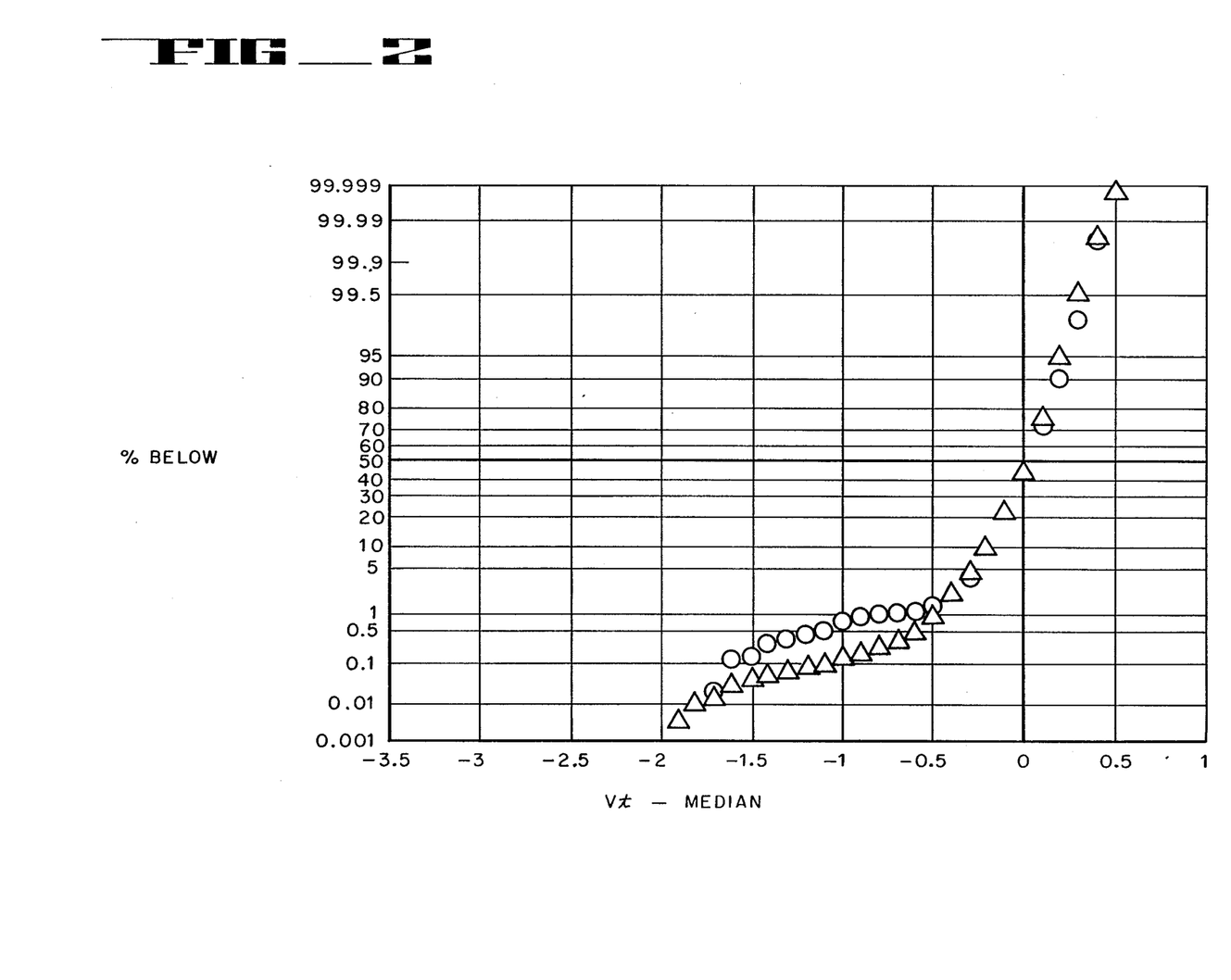
FIG. 2 shows the erase distribution of the cells within two EEPROM devices as measured during a single cycle.

Alternatively, the same procedure may be applied wherein the read voltage, rather than the erase voltage, is successively incremented. FIG. 2 illustrates two erase distributions generated in this way from measurements taken on two separate EEPROM memory arrays (as shown by the circular and triangular data points). In the distribution plots of FIG. 2, the relative threshold voltage of the cells is plotted along the X-axis. The Y-axis indicates the percentage of bits within the array which turn-on at a give voltage threshold.

As is clearly seen, the circle distribution has a larger percentage of bits in its erase tail when compared to the triangle distribution. Consequently, this part (i.e., the IC characterized by the circle plot) will suffer an endurance failure after fewer cycles relative to the "triangle" IC. Note that the date of FIG. 2 is normalized so that a voltage threshold of 0 volts corresponds exactly to the 50% point of the distribution. Normalizing the data helps obviate the need for correlation of absolute voltages.

Statistically, if the earse distribution where truly "normal" (i.e., characterized by a bell-shaped curve) the individual data points would form a straight line intersecting the 50% point at 0 volts. The relative position of the individual bits within this line would be due to various things such as differences in oxide thicknesses, critical dimensions, uniformity and other process variables. As can be seen, however, only about 95% of the bits actually lie within a linear portion of the curve. The approximately 5% of the bits which fall outside of the linear portion of the curve of FIG. 2 lie within a region known as the "erase tail". These are bits which erase significantly faster and/or further than the other "normal" bits of the array. Empirically, it is observed that parts which fail cycling early have a larger erase tail when compared with parts which cycle longer before failing. (A larger "erase tail" in this sense means a larger percentage of bits of the array are found within the erase tail).

Figure 3:
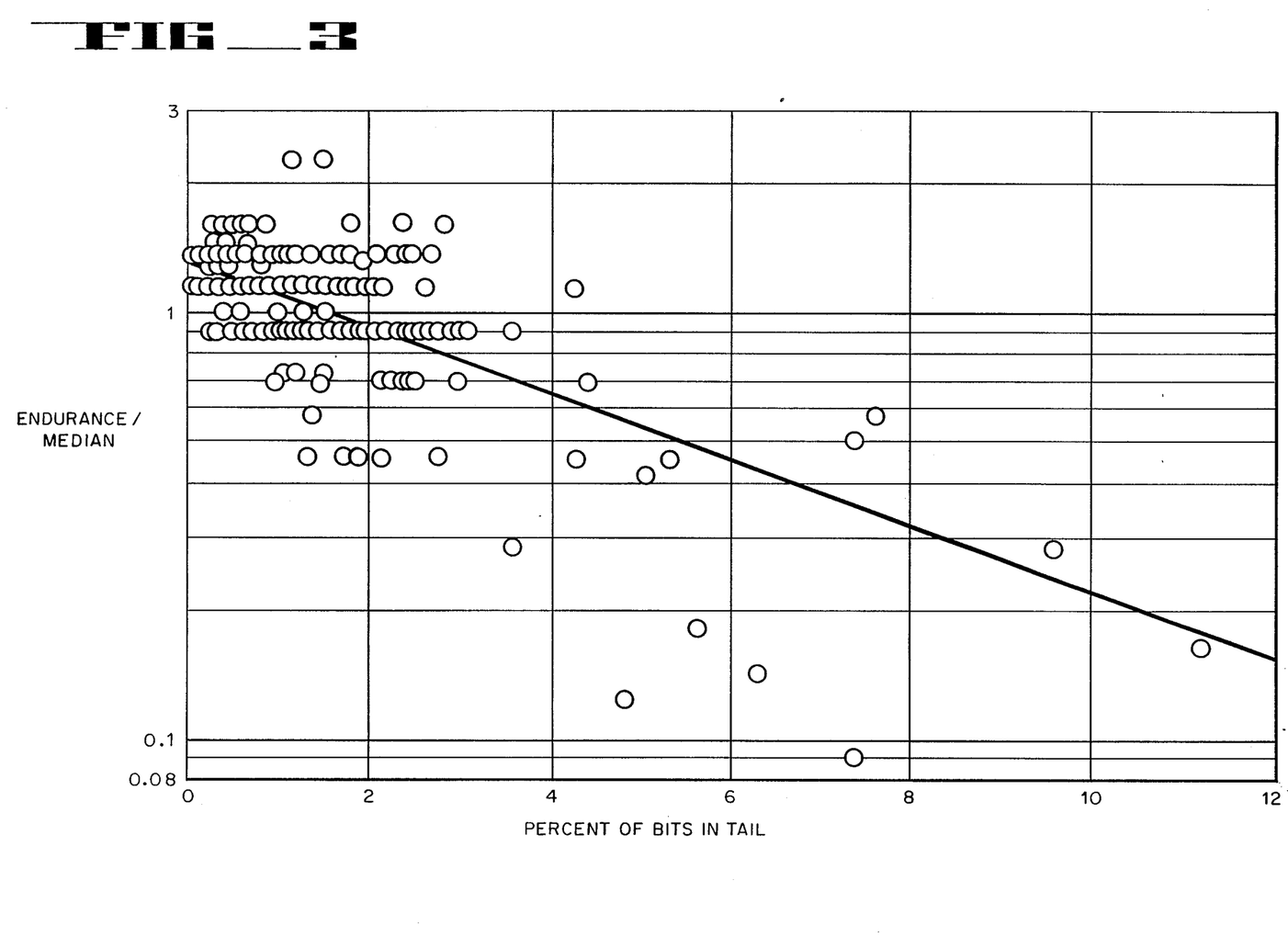
FIG. 3 shows the endurance of EEPROM devices as a function of the number of bits measured and the erase tail of the erase distribution.

Referring now to FIG. 3, the actual measured endurance of a group of three different EEPROM arrays is plotted as a function of the number of bits present within their respective erase tails, Note that each data point in FIG. 3 represents a single array. Endurance was measured by continually cycling the device until failure occurred; the number of cycles was then recorded. The number of bits within the tail for each array was measured and divided by the total number of bits within the array (2K and plotted as a percentage along the X-axis against the measured endurance. The erase tail is measured beginning at the point where the erase distribution curve begins to deviate from the linear region. In the case of the EEPROM arrays of FIG.

3, this occurred about 0.5 volts below the median (see FIG. 2).

It is appreciated that for other processes having different degrees of variation within the process, different erase distributions, characterized by different slopes, may be generated. For instance, in other process the erase tail may start at a different voltage below the median of the erase distribution—perhaps 0.3 or 0.7 volts below the median instead of a 0.5 volts. In the currently preferred embodiment, after the median is calculated a cell count is taken at the gate turn-on voltage (0.5V below the median. (The cell count is a measure of the number of cells with enhanced erase characteristics). Note that FIG. 3, the actual endurance (in cycles) of each array is divided by the median endurance for that cell type. This technique of normalization allow all of the data for each cell type to be plotted concurrently on the same graph.

Figure 4:
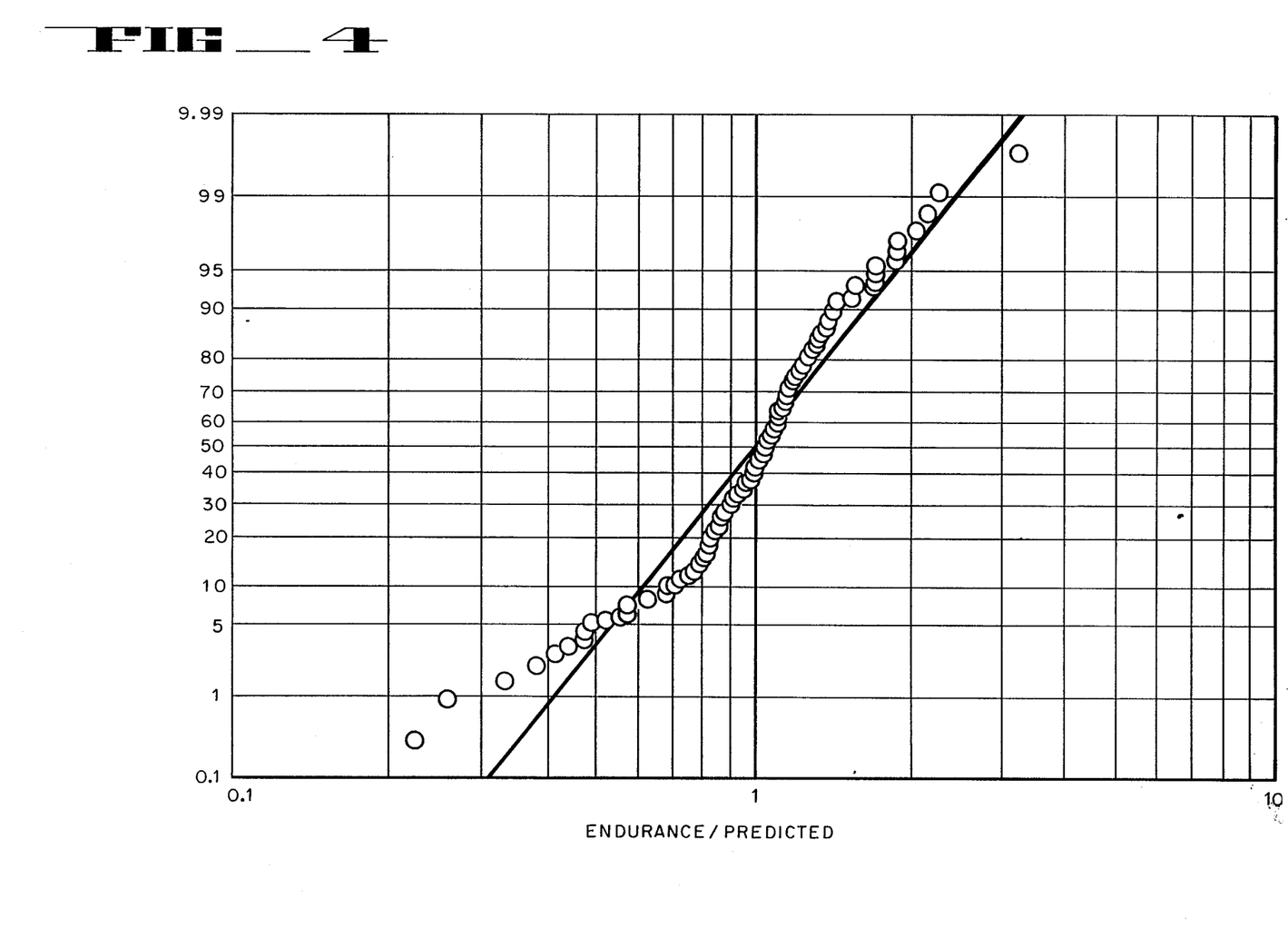
FIG. 4 shows the discrepancy between the predictive model for endurance failure of the present invention for a single EEPROM device versus the same devices actual endurance.

FIG. 4 illustrates that there exists a good correlation between the number of bits in the erase tail and the actual endurance of the device as measured by repeated cycling. A least-squares fit to the data of FIG. 3 yields the following model for predicting endurance failure in floating gate memory arrays:

$$\text{predicted endurance (cycles)} = 462,000 * e^{-0.337 * T} \quad (1)$$

where T is the ease cell count mentioned above, expressed as a percentage of the total number of cells in the IC.

Based on the data of FIG. 3, screening for premature endurance failures is expedited by firs measuring the erase distribution of a part in the first cycle. If that part's erase tail exceeds approximately 6% of the total bits in the array, the part is downgraded as less reliable. It should be understood that the 6% figure may vary for each type of EPROM or EEPROM device, and also on the reliability requirements of the end use. However, once a sufficient amount of data has been gathered for a given device type, an endurance versus tail plot can utilized to quickly screen individual ICs for production use.

FIG. 4 shows the residual of the data in FIG. 3; that is the discrepancy between the model's prediction for a given part and the part's actual measured endurance, expressed as a ratio. As is evident, in 99% of the cases, the model is accurate to within a factor of three of the actual endurance. Considering that an IC process usually has an intrinsic margin factor of approximately seven, these results indicate that the predictive model is quite precise.

To recapitulate, the basic steps of the present invention are as follows: Characteristics of the program and-/or erase distributions are first measured on the IC under consideration. According to the preferred embodiment, this is achieved by determining the threshold voltage for each cell for successive increments of the applied control gate voltage. The number of turned-on cells are recorded at each gate voltage. Next, the median threshold voltage is calculated and cell count is taken at the gate turn on voltage point at which the erase tail begins to form (approximately 0.5 volts below the median in the currently preferred embodiment).

The measured distribution characteristics are then used to estimate the endurance of the integrated circuit using a correlation relationship established on earlier samples of similar ICs. For example, in the preferred embodiment of the presently invented method correlation is established according to equation (1).

It should be mentioned that, from a practical standpoint, every cell within the memory array need not be exhaustively measured in the manner described above in order to form an accurate erase distribution for the IC under consideration. Most often, the erase distribution can simply be generated by measuring or sampling a subset of the cells within the array. This tactic frequently helps to speed up the measurement process without compromising overall screening accuracy.

Although the present invention only uses the distribution median and a single cell count, it is appreciated that this is merely one means by which distribution parameters may be used to predict endurance. Other possible means include using correlating to the distribution width; the difference between the mean or median and minimum or maximum, cell counts at more than one level between the minimum and maximum, a weighted sum of cell counts multiplied by the position in the distribution at which those cell counts are taken, or to the length of the distribution tail (approximately the median minus the minimum).

Therefore, whereas many alternations and modification of the present invention will no doubt become apparent to a person of ordinary skill in the art after having read the foregoing description, it is to be understood that the particular embodiments shown and described by way of illustration are in no way intended to be considered limiting. Reference to the details of the preferred embodiments are not intended to limit the scope of the claims which themselves recite only those features regarded as essential to the invention.

Thus, a method for screening integrated circuit of endurance reliability failures has been described.

I claim:

1. A method of screening an integrated circuit (IC) for endurance failure, said IC being of the type which contains an array of floating gate memory cells which are programmed and/or erased by tunnelling of electrons to/from a floating gate through a tunnel oxide, said method comprising the steps of:

measuring either the program or erase speed of said cells to obtain a distribution in which the percentage of bits either programmed or erased is available as a function of the applied voltage threshold, said distribution being characterized as having a tail representing the percentage of said bits which program or erase relatively fast; and classifying said IC as being likely to suffer early endurance failure if said tail exceeds a certain percentage of the total bits in said array, otherwise certifying said IC as being endurance reliable.

2. The method of claim 1 wherein said measuring step comprises the steps of:

(a) applying a program/erase potential to said cells;
(b) recording the number of bits programmed/erased;
(c) incrementing said program/erase potential;
(d) repeating steps (b) and (c) until all of said cells have been programmed/erased.

3. The method of claim 2 further comprising the step of:

(e) calculating the median threshold voltage of said distribution.

4. The method of claim 1 wherein said measuring step is performed before said IC has undergone significant cycling.

5. The method of claim 2 wherein said measuring steps are performed on a subset of said cells.

6. The method of claim 1 wherein said certain percentage is approximately 6%.

7. A method of screening an integrated circuit (IC) for endurance failure, said IC being of the type which contains an array of floating gate memory cells which are erased by tunnelling of electrons from the floating gate through a tunnel oxide, said method comprising the steps of:
measuring the erase distribution characteristics of said IC by
(a) applying a potential to the control gate of each of said cells;
(b) determining the number of turned-on cells at said potential;
(c) incrementing said potential;
(d) determining the number of turned-on cells at said incremented potential;
(e) repeating steps (c) and (d) until virtually all of said cells have been turned-on, said erase distribution having an erase tail representing the percentage of said bits which erase relatively fast; and
classifying said IC as being likely to suffer early endurance failure if said tail exceeds a certain percentage of the total bits in said array, otherwise certifying said IC as being endurance reliable.

8. The method of claim 7 wherein said measuring step further comprises the steps of:
calculating a median threshold voltage; and
taking a cell count at the gate turn-on voltage point at which said erase tail beings.

9. The method of claim 8 wherein said measuring step is performed before said IC has undergone significant cycling.

10. The method of claim 9 wherein said measuring step is performed on a subset of said cells.

11. A method of predicting the endurance failure of an integrated circuit (IC), said IC being of the type which contains an array of floating gate memory cells which are erased by tunnelling of electrons from the floating gate through a tunnel oxide, said method comprising the steps of:
measuring the erase distribution characteristics of said IC by
(a) applying a potential to the control gate of each of said cells;
(b) determining the number of turned-on cells at said potential;
(c) incrementing said potential;
(d) determining the number of turned-on cells at said incremented potential;
(e) repeating steps (c) and (d) until virtually all of said cells have been turned-on, said erase distribution having an erase tail representing a percentage of said bits which erase relatively fast;
calculating a median threshold voltage;
taking a cell count at the gate turn-on voltage point at which said erase tail begins; and
estimating the endurance of said IC using a correlation relationship established on endurance measurements of similar ICs.

12. The method of claim 10 wherein said correlation relationship comprises the equation $$\text{predicted endurance (cycles)} = K^* e^{-C^*T} \qquad (1)$$

where T represents said cell count expressed as a percentage of said cells, and K and C are constants particular to the type of process employed in fabricating said ICs.

13. A method of screening an integrated circuit (IC) for endurance failure, said IC being of the type which contains an array of floating gate memory cells which are erased by tunnelling of electrons form the floating gate through a tunnel oxide, said method comprising the steps of:
measuring the erase distribution characteristics of said IC by
(a) applying a potential to the control gate of each of said cells;
(b) determining the number of turned-on cells at said potential;
(c) incrementing said potential;
(d) determining the number of turned-on cells at said incremented potential;
(e) repeating steps (c) and (d) until virtually all of said cells have been turned-on, said erase distribution having an erase tail representing a percentage of said bits which erase relatively fast;
calculating a median threshold voltage;
taking a cell count at a certain gate turn-on voltage below said median threshold voltage; and
classifying said IC as being likely to suffer early endurance failure if said cell count exceeds a certain percentage of the total bits in said array, otherwise certifying said IC as being endurance reliable.

14. The method of claim 13 wherein said certain gate turn-on voltage is about 0.5 volts below said median threshold voltage.

15. The method of claim 14 wherein said certain percentage is approximately 6%.

* * * * *

UNITED STATES PATENT AND TRADEMARK OFFICE
CERTIFICATE OF CORRECTION

PATENT NO. : 4,963,825
DATED : 10/16/90
INVENTOR(S) : Neal R. Mielke

It is certified that error appears in the above-identified patent and that said Letters Patent is hereby corrected as shown below:

| | | |
|---|---|---|
| Col. 2, Line 2 | Delete "int he" | Insert --in the-- |
| Col. 2, Line 15 | Delete "." | after the word "is" |
| Col. 2, Line 27 | Delete "bail" | Insert --fail-- |
| Col. 5, Line 13 | Delete "int he" | Insert --in the-- |

Signed and Sealed this

Tenth Day of August, 1993

Attest:

MICHAEL K. KIRK

Attesting Officer

Acting Commissioner of Patents and Trademarks